(12) United States Patent
Taddeo

(10) Patent No.: US 7,477,559 B2
(45) Date of Patent: Jan. 13, 2009

(54) SENSE AMPLIFIER FOR LOW-VOLTAGE APPLICATIONS

(75) Inventor: Alberto Taddeo, Arenzano (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 11/265,781

(22) Filed: Nov. 1, 2005

(65) Prior Publication Data

US 2007/0097767 A1 May 3, 2007

(51) Int. Cl.
*G11C 7/00* (2006.01)
(52) U.S. Cl. .................. 365/205; 365/208; 365/191
(58) Field of Classification Search .............. 365/205, 365/208, 191, 189.11, 154, 230.06, 104, 365/222, 159, 189.09
See application file for complete search history.

(56) References Cited

U.S. PATENT DOCUMENTS

| | | | | |
|---|---|---|---|---|
| 6,389,524 | B1 * | 5/2002 | Sato | 711/212 |
| 6,683,804 | B1 * | 1/2004 | Eby et al. | 365/154 |
| 6,954,102 | B2 * | 10/2005 | Bedarida et al. | 327/539 |
| 7,236,409 | B2 * | 6/2007 | Isobe | 365/189.11 |
| 2003/0231523 | A1 * | 12/2003 | Cho et al. | 365/189.05 |

* cited by examiner

*Primary Examiner*—Dang T Nguyen
(74) *Attorney, Agent, or Firm*—Lisa K. Jorgenson; Bryan A. Santarelli; Graybeal Jackson LLP

(57) ABSTRACT

A sense amplifier for reading a memory cell is provided. The sense amplifier includes a first input branch for applying a biasing voltage to the memory cell through regulation means and for receiving a first input current indicative of a state of the memory cell, the regulation means including a first controlled element having a voltage-controlled conductivity and a control element for applying a first control voltage corresponding to the first input current to the first controlled element, and sensing means for determining the state of the memory cell according to a comparison between the first input current and a reference value; the sensing means includes a second input branch including a second controlled element (M3$m$), shifting means (215$m$) for applying a second control voltage equal to the first control voltage shifted by a predetermined offset to the second controlled element, a second input current corresponding to the second control voltage flowing through the second input branch, and comparison means for comparing the second input current with the reference value.

10 Claims, 6 Drawing Sheets

SENSE AMPLIFIER FOR LOW-VOLTAGE APPLICATIONS

TECHNICAL FIELD

The present invention relates to the electronic field. More specifically, the present invention relates to sense amplifiers for reading memory cells.

BACKGROUND

Memory devices (such as flash memories) are commonly used to store data. Typically, a memory device includes a matrix of memory cells (for example, consisting of floating-gate MOS transistors with a programmable threshold voltage). During a reading operation, selected memory cells are suitably biased so that a current sunk by each memory cell (flowing through a corresponding bitline) will be indicative of its threshold voltage (and then of the logic value stored therein).

The reading of each memory cell is generally implemented by means of a sense amplifier; the sense amplifier correctly biases the memory cell and then compares the corresponding current with another current provided by a reference cell. In the solutions known in the art, the sense amplifier is based on a current-to-voltage converter (typically consisting of a pair of transistors in current-mirror configuration); this element converts the cell current and the reference current into corresponding voltages, which are then fed to a comparator. Preferably, each branch of the current mirror includes a biasing circuit, which is formed by a cascode transistor with an inverter in feedback configuration. This biasing circuit speeds-up the charging of stray capacitances intrinsically associated with the bitline, then reducing a transient phase of the reading operation; moreover, it decouples the current mirror from this high capacitive load (thereby improving its performance). Accordingly, the time required for accessing the data stored in the memory device is greatly reduced.

Nowadays, many memory devices are designed to work with low-power supply voltages (for example, down to 1.2-1.8 V). The use of low-power supply voltages allows exploiting technologies based on very thin gate oxide layers; therefore, it is possible to implement memory devices that are more compact and exhibit lower power consumption.

Nevertheless, it is preferred not to scale down the voltage that is used to bias the memory cell during the reading operation (in order to keep the current sunk by the memory cell relatively high). In fact, a reduction of the cell current would increase the discharge time of the corresponding bitline. This has a negative impact on the access time of the memory device; the problem is particular acute in fast logic circuits, such as microprocessors, DSPs, peripherals and the like. Optimal values of the biasing voltage (which do not affect operation of the memory device) are about 0.8-0.9 V.

Therefore, a measure voltage (which is provided to the comparator by the branch of the current mirror associated with the memory cell) has a swing that is restrained between the biasing voltage that has to be applied to the memory cell (0.8-0.9V) and the supply voltage that is available for operating the current mirror (down to 1.2 V). This reduced swing of the measure voltage impairs the accuracy of the sense amplifier (since it hinders the discrimination of the different logic values stored in the memory cell). Moreover, in the worst-case working conditions of the memory device the supply voltage may also fall towards lower values (down to 0.9-1 V); in this case, the correct operation of the sense amplifier cannot be guaranteed.

A solution to the problem is described in US Patent Publication No. 2104/0160837. In this case, the current mirror is connected in parallel to the bitline. The bitline is then biased by a circuit including a MOS transistor that is cascode-connected to an operational amplifier; the operational amplifier receives a reference voltage and the bitline voltage, and then controls the MOS transistor accordingly. However, this architecture increases the access time (with respect to the solutions based on the inverter); moreover, the converter is now forced to operate below the bitline voltage.

Alternative solutions exploit charge pumps for supplying voltages bootstrapped with respect to the supply voltage to the sense amplifier. However, these solutions involve higher power consumption and introduce noise problems.

SUMMARY

According to an embodiment of the present invention, the idea of generating a further current for the comparison from the voltage controlling the cascode transistor is suggested.

Particularly, an embodiment of the invention proposes a sense amplifier for reading a memory cell. The sense amplifier includes a first input branch, which is adapted to apply a biasing voltage to the memory cell through regulation means and to receive a first input current indicative of a state of the memory cell. The regulation means includes a first controlled element (having a voltage-controlled conductivity) and a control element for applying a first control voltage, corresponding to the first input current, to the first controlled element. Sensing means is used for determining the state of the memory cell according to a comparison between the first input current and a reference value. The sensing means includes a second input branch with a second controlled element. Shifting means is provided for applying a second control voltage (equal to the first control voltage shifted by a predetermined offset) to the second controlled element; in this way, a second input current corresponding to the second control voltage flows through the second input branch. Comparison means is then used for comparing the second input current with the reference value.

In another embodiment of the invention, the sense amplifier includes a reference section with a symmetric structure.

Typically, the regulation means is implemented by means of a cascode transistor with a feedback inverter.

A suggested choice for achieving the desired result is of using an auxiliary transistor (coupled with the cascode transistor) and a diode for shifting the respective control voltage.

Advantageously, the threshold voltage of each cascode transistor is lower than the threshold voltage of the corresponding auxiliary transistor.

As a further improvement, a limiting current (equal to a fraction of the reference current so converted) is applied to the diode.

Typically, the sense amplifier includes a current mirror (which performs a current-to-voltage conversion) and a voltage comparator.

A way to further improve this embodiment is of mirroring the converted reference current into a service current, from which there is obtained the desired voltage to be applied to the comparator (so as to allow equalizing its input nodes).

A further embodiment of the present invention provides a non-volatile memory device including one or more of the proposed sense amplifiers.

A still further embodiment of the present invention provides a corresponding method for reading a memory cell.

Another embodiment of the invention, and features and advantages thereof, will be best understood by reference to the following detailed description, given purely by way of a non-restrictive indication, to be read in conjunction with the accompanying drawings.

DETAILED DESCRIPTION

Figure 1A:
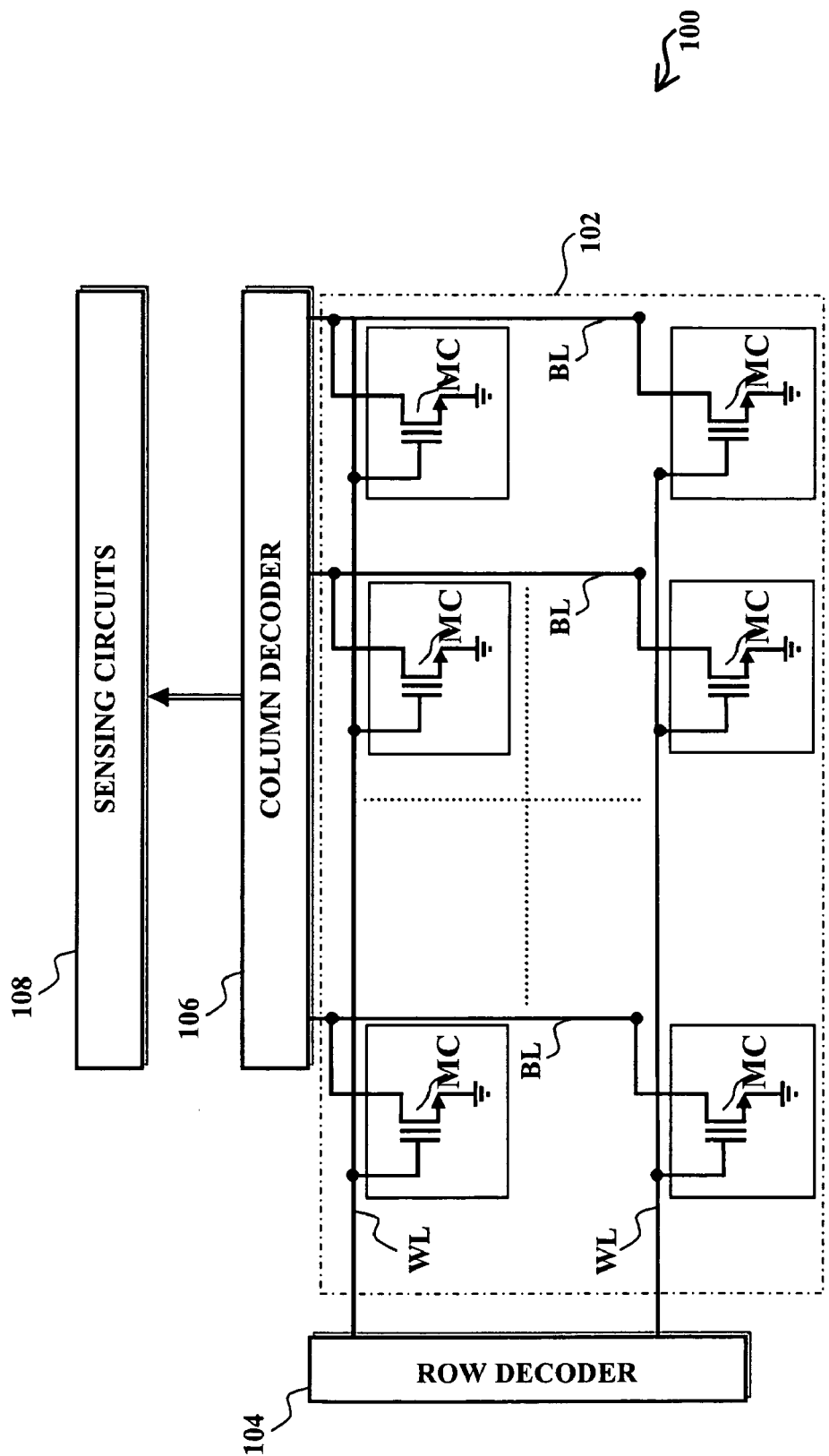
FIG. 1A is a schematic diagram of a portion of a memory device wherein the solution according to an embodiment of the invention is applicable.

With reference to the drawings, and in particular to FIG. 1A, a portion of a non-volatile memory device 100 is schematically shown according to an embodiment of the invention; for example, the memory device 100 includes a flash memory, which is integrated on a chip of semiconductor material. The memory device 100 includes multiple memory cells $MC_{ij}$ arranged in a matrix 102 with M rows and N columns (with i=1, ..., M−1 and j=1, ..., N−1). Each row of the matrix 102 is associated with a wordline $WL_i$ and each column is associated with a bitline $BL_j$, so that a generic memory cell $MC_{ij}$ is univocally identified by the respective wordline $WL_i$ and bitline $BL_j$. A row decoder 104 is connected to the wordlines $WL_i$ and a column decoder 106 is connected to the bitlines $BL_j$ for selecting the desired memory cells $MC_{ij}$ (in response to a corresponding address).

Each memory cell $MC_{ij}$ is, for example, implemented by a floating gate MOS transistor having a drain terminal connected to the corresponding bitline $BL_j$, a control gate terminal connected to the corresponding wordline $WL_i$, and a source terminal connected to a reference terminal (providing a reference voltage, or ground). The memory cell $MC_{ij}$ can take different states, which are associated with corresponding ranges of its threshold voltage. For example, in the case of a two-level memory device, the memory cell $MC_{ij}$ has two possible states defined by a low and a high threshold voltage (which are associated by convention with the logic values '1' and '0', respectively). When the memory cell $MC_{ij}$ is biased for reading, a current flowing through the memory cell $MC_{ij}$ will be indicative of the logic value stored therein; particularly, a value Im'1' of the current corresponding to the logic value '1' is higher than a value Im'0' of the current corresponding to the logic value '0'.

Sensing circuits 108 of the memory device 100 include a plurality of sense amplifiers for reading the selected memory cells $MC_{ij}$ (in a number equal to the data parallelism of the memory device 100 defining its word length, such as 8 or 16). For this purpose, during a reading operation each sense amplifier is connected to a corresponding selected bitline $BL_j$ (by the column decoder 106). The sense amplifier biases the selected memory cell $MC_{ij}$ correctly for the reading; at the same time, the sense amplifier detects the current sunk by the memory cell $MC_{ij}$ through its bitline $BL_j$ (being the other memory cells $MC_{ij}$ biased by the row decoder 104 so as to be always non-conductive) and then determines the logic value stored therein.

Figure 1B:
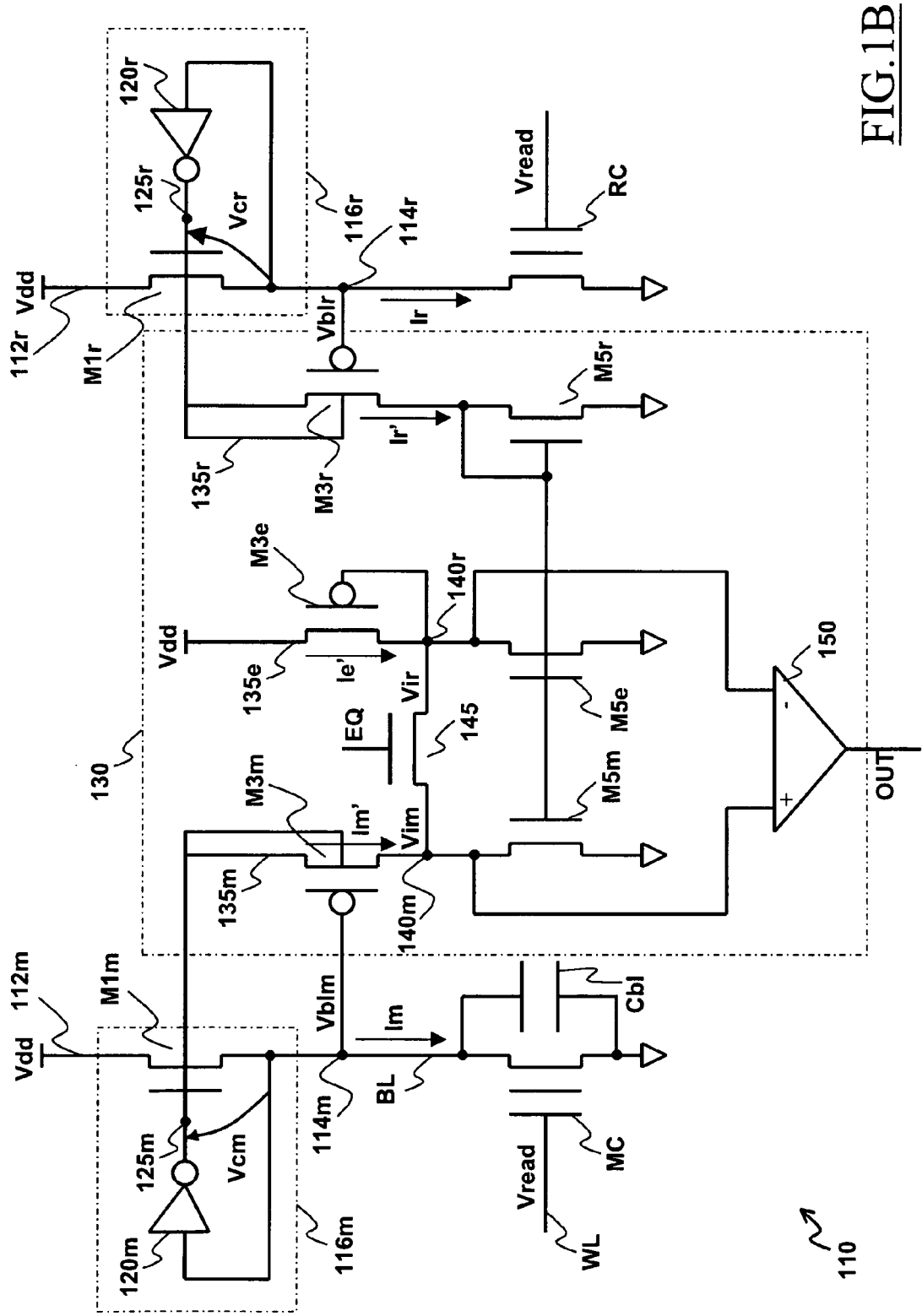
FIG. 1B is a schematic diagram of a sense amplifier that can be used in the memory device.

Referring now to FIG. 1B, there is shown a possible circuital scheme of a generic sense amplifier denoted with 110 (in the following, the indexes i,j will be omitted for the sake of simplicity). This sense amplifier 110 is disclosed in the co-pending Italian application No. MI2004A002074 filed on 29 Oct. 2004 (the entire disclosure of which is herein incorporated by reference). Briefly, the sense amplifier 110 compares a cell current Im, sunk by the (selected) memory cell MC, with a reference current Ir, provided by a reference cell RC (structurally identical to the memory cells of the memory device). The reference cell RC has a threshold voltage that has been set so as to deliver (when properly biased) a reference current Ir with an intermediate value between the values Im'1' and Im'0'.

The sense amplifier 110 has a symmetric structure with a measure branch 112m, which receives the cell current Im at an input node 114m, and a reference branch 112r, which receives the reference current Ir at an input node 114r. It should be noted that in the figure the memory cell MC and the reference cell RC are directly connected to the branch 112m and to the branch 112r, respectively (by omitting the selection circuits of the column decoder for the sake of simplicity); in other words, the memory cell MC and the reference cell RC have the drain terminals connected to the input node 114m and to the input node 114r, respectively.

A cascode-configured biasing circuit 116m,116r (hereinafter referred to as cascode circuit) is included in each branch 112m,112r. The cascode circuit 116m,116r is exploited to bring a bitline voltage Vblm,Vblr at the drain terminal of the cell MC,RC (i.e., at the input node 114m,114r) towards the correct biasing value quickly, irrespectively of the relatively high capacitive load, represented by a capacitor Cbl, due to stray capacitances associated with the bitline BL (typically of about 1-3 pF).

The circuit 116m,116r includes a cascode n-MOS transistor M1m,M1r that is controlled by an inverter 120m,120r. In detail, the cascode transistor M1m,M1r has the drain terminal connected to a terminal providing a power supply voltage Vdd (for example, 1.2-1.8V with respect to ground), the gate terminal connected to the output terminal of the inverter 120m,120r (control node 125m,125r), and the source terminal connected to the input node 114m,114r. The inverter 120m,120r has the input terminal connected to the node 114m,114r, so as to implement a feed-back network between the gate and source terminals of the cascode transistor M1m, M1r. Therefore, a measure control voltage Vcm falling between the control node 125m and the input node 114m depends on the bitline voltage Vblm (and then on the cell current Im), whereas a reference control voltage Vcr falling between the control node 125r and the input node 114r depends on the bitline voltage Vblr (and then on the reference current Ir).

In addition, the sense amplifier 110 includes a differential stage 130 connected to the input nodes 114m,114r and to the control nodes 125m,125r (of the branches 112m,112r), so as to receive the control voltages Vcm and Vcr. More in detail, the differential stage 130 includes two (auxiliary) conversion p-MOS transistors M3m and M3r having the source terminals connected to the control nodes 125m and 125r, and the gate terminals connected to the input nodes 114m and 114r, respectively. Accordingly, the voltage between the gate and source terminals of the conversion transistors M3m and M3r is equal to the control voltages Vcm and Vcr, respectively. Therefore, a converted cell current Im' and a converted reference current Ir' sunk by the conversion transistors M3m and M3r (defined by the control voltages Vcm and Vcr) will correspond to the cell current Im and to the reference current Ir, respectively.

The correct operation of the sense amplifier 110 requires that the conversion transistor M3m,M3r should always be conductive when the cascode transistor M1m,M1r is conductive. For this purpose, the body terminal of the cascode transistor M1m,M1r is connected to the ground terminal (not shown in the figure); in this way, the voltage between its source and body terminals increases the respective threshold voltage because of the so-called body-effect. Conversely, the body terminal of the conversion transistor M3m,M3r is short-circuited to the source terminal as usual. As a result, the threshold voltage of the conversion transistor M3m,M3r is lower than the threshold voltage of the cascode transistor M1m,M1r (for the same structure); in this way, the conversion transistor M3m,M3r will be always switched on before the cascode transistor M1m,M1r (by the same control voltage Vcm,Vcr). In any case, when the threshold voltage of the transistor M3m,M3r is lower than the threshold voltage of the transistor M1m,M1r, it is also possible to connect the body terminal of the transistor M3m,M3r to the power supply terminal.

The differential stage 130 also includes a service p-MOS transistor M3e in diode configuration (with the drain terminal connected to the gate terminal); the source terminal of the service transistor M3e receives the supply voltage Vdd. A service current (denoted with Ie') flows through the transistor M3e.

A (multiple) current mirror is formed by three n-MOS transistors M5m, M5r and M5e, which have the gate terminals connected together and the source terminals connected to the ground terminal. The transistor M5r is in diode configuration (with the drain terminal connected to the gate terminal). The drain terminals of the transistors M5m and M5e are connected to the drain terminals of the transistors M3m and M3e, so as to define a measure output node 140m and a reference output node 140r, respectively. The drain terminal of the transistor M5r is connected to the drain terminal of the conversion transistor M3r. The current mirror so defined has a measure branch 135m defined by the transistor M5m, a reference branch 135r defined by the transistor M5r, and a service branch 135e defined by the transistor M5e. The transistors M5m, M5r and M5e have substantially the same size, so that the current mirroring ratio of the circuit M5m,M5r, M5e is about 1. Furthermore, the transistors M3m, M3r and M3e are also equivalent, so as to have roughly equal loads on the branches 135m, 135r and 135e.

An equalizing n-MOS transistor 145 connects the branches 135m and 135e. Particularly, the equalizing transistor 145 has a first (source/drain) terminal connected to the output node 140m and a second (drain/source) terminal connected to the output node 140r. The gate terminal of the equalizing transistor 145 is controlled by an equalization signal EQ.

The sense amplifier 110 further includes a comparator 150 consisting of a differential amplifier. The non-inverting input terminal ("+") of the comparator 150 is connected to the output node 140m (for receiving a measure input voltage denoted with Vim), whereas its inverting input terminal ("−") is connected to the reference output node 140r (for receiving a reference input voltage denoted with Vir). The comparator 150 amplifies the difference between the input voltages Vim and Vir, and provides a comparison signal OUT indicative of the result of the comparison.

When a reading operation is performed, the gate terminals of the memory and reference cells MC and RC are biased to a suitable reading voltage Vread (for example, 1V). In a first (precharge) phase of the reading operation, the equalization signal EQ is asserted (logic value 1) so that the equalizing transistor 145 is on.

The memory and reference cells MC and RC start sinking the cell current Im and the reference current Ir, respectively. In this first phase, the cell current Im is relatively high for precharging the stray capacitor Cbl; at the same time, the control voltage Vcm is high as well. Therefore, the converted cell current Im' will tend to have a high value (since it depends on the control voltage Vcm). However, the current mirror M5m,M5e,M5r limits the converted cell current Im' thanks to the converted reference current Ir' (depending on the reference current Ir), which is mirrored onto the branches 135m and 135e.

At the end of the first phase, the measure and reference currents Im and Ir reach a steady-state value, depending on the logic value stored in the memory cell MC and on the programming state of the reference cell RC, respectively; then, the control voltages Vcm and Vcr reach a corresponding steady-state value as well. At the same time, the input voltages Vim and Vir are maintained at a common equalizing value (by the equalization transistor 145). This equalization ensures that the comparator 150 does not amplify any spurious signal (between the output nodes 140m and 140r). It should be noted that the desired result could not be reached by connecting the output node 140m directly to the branch 135r, since the diode-connected conversion transistor M3r would not ensure a correct limitation of the converted cell current Im'.

In a second (evaluation) phase of the reading operation the equalization signal EQ is de-asserted (logic value 0) and, then, the converted cell current Im' flows completely through the branch 135m. The converted reference current Ir' is mirrored onto the converted cell current Im'; the input voltage Vim then moves to a steady-state value depending on the difference between the converted cell current Im' and the converted reference current Ir'. The converted reference current Ir' is further mirrored onto the service current Ie' (flowing through the branch 135e). Accordingly, the input voltage Vir (at the output node 140r along the branch 135e) moves to a steady-state value depending on the converted reference current Ir'.

Then, the difference between the converted cell current Im', flowing through the branch 135m, and the converted reference current Ir', equal to the service current Ie' flowing trough the branch 135e, generates a difference between the input voltage Vim at the node 140m and the input voltage Vir at the node 140r. Particularly, if the cell current Im is greater than the reference current Ir, the input voltage Vim exceeds the input voltage Vir; otherwise, the input voltage Vim falls below the input voltage Vir. The comparator 150 generates the comparison signal OUT accordingly; particularly, the comparison signal OUT will take a high logic value '1' when the input voltage Vim is higher than the input voltage Vir (i.e., the cell current Im is greater than the reference current Ir) or a low logic value '0' when the input voltage Vim is lower than the input voltage Vir (i.e, the cell current Im is smaller than the reference current Ir). In other words, the comparison signal OUT provides the logic value stored in the memory cell MC.

The architecture of the above-described sense amplifier 110 allows exploiting the traditional cascode circuit 116m, 116r, which ensures a fast precharge of the bitline BL. It is observed that the correct operation of the cascode circuit 116m,116r is not affected by the differential stage 130 connected thereto. In fact, the current sunk by the branches 135m, 135r and 135e of the differential stage 130 is limited to a relatively low value (for example, a few tens of microampere), so that the precharge rapidity is not significantly affected.

Furthermore, the node 140*m* providing the input voltage Vim exhibits an increased swing with respect to the other sense amplifiers known in the art. In fact, the output node 140*m* can take values ranging from ground to the voltage at the output terminal of the inverter 120*m*,120*r* (close to the supply voltage Vdd).

It should also be noted that the output node 140*m* moves quickly towards its steady-state value during the reading operation, because it is decoupled from the stray capacitor Cbl (of the bitline BL).

The conversion of the cell current Im into a voltage, adapted to be compared with a reference voltage for discriminating the logic value stored in the memory cell MC, exploits both the voltage at the output terminal of the inverter 120*m* in the cascode circuit 116*m* and the bitline voltage Vblm. Accordingly, the above-described sense amplifier 110 implements a "direct sensing" of the bitline voltage Vblm. This direct sensing ensures a high accuracy of the reading operation.

Finally, it has to be observed that the conversion transistor M3*m* can be sized in such a way that at the steady-state the converted cell current Im' is proportional to the cell current Im and, particularly, greater than the cell current Im. This improves the access time of the memory device, because the output node 140*m* now moves more quickly towards its steady-state value. The fact that the converted cell current Im' is greater than the cell current Im is not a problem in such a symmetric sense amplifier 110, in which the converted reference current Ir' is generated in the same way.

Then, the sense amplifier 110 can also operate with a supply voltage Vdd of quite low value, at the same time maintaining an access time of the order of a few tens of nanoseconds (for example, 10-30 ns).

The architecture described above, although satisfactory under many aspects, may, however, be affected by a problem that will be illustrated in the following.

Indeed, the bitline voltage Vblm can reach at most a value equal to the supply voltage Vdd minus the threshold voltage of the cascode transistor M1*m* (relatively high to ensure the conduction of the auxiliary transistor M3*m*). Assuming that the supply voltage Vdd is very low (for example, equal to 1.2 V) and that the threshold voltage of the cascode transistor M1*m* is of a few hundreds of mV (for example, about 300 mV), the bitline voltage Vblm can reach at most a value of 0.9 V. In addition, considering that the supply voltage Vdd in the worst-case working conditions of the memory device can fall down to 0.9-1.0 V, the bitline voltage Vblm would take a value of 0.6 V, thus adversely affecting the rapidity in providing the steady-state cell current Im (considering that an optimal value thereof should be of about 0.8-0.9 V).

Figure 2:
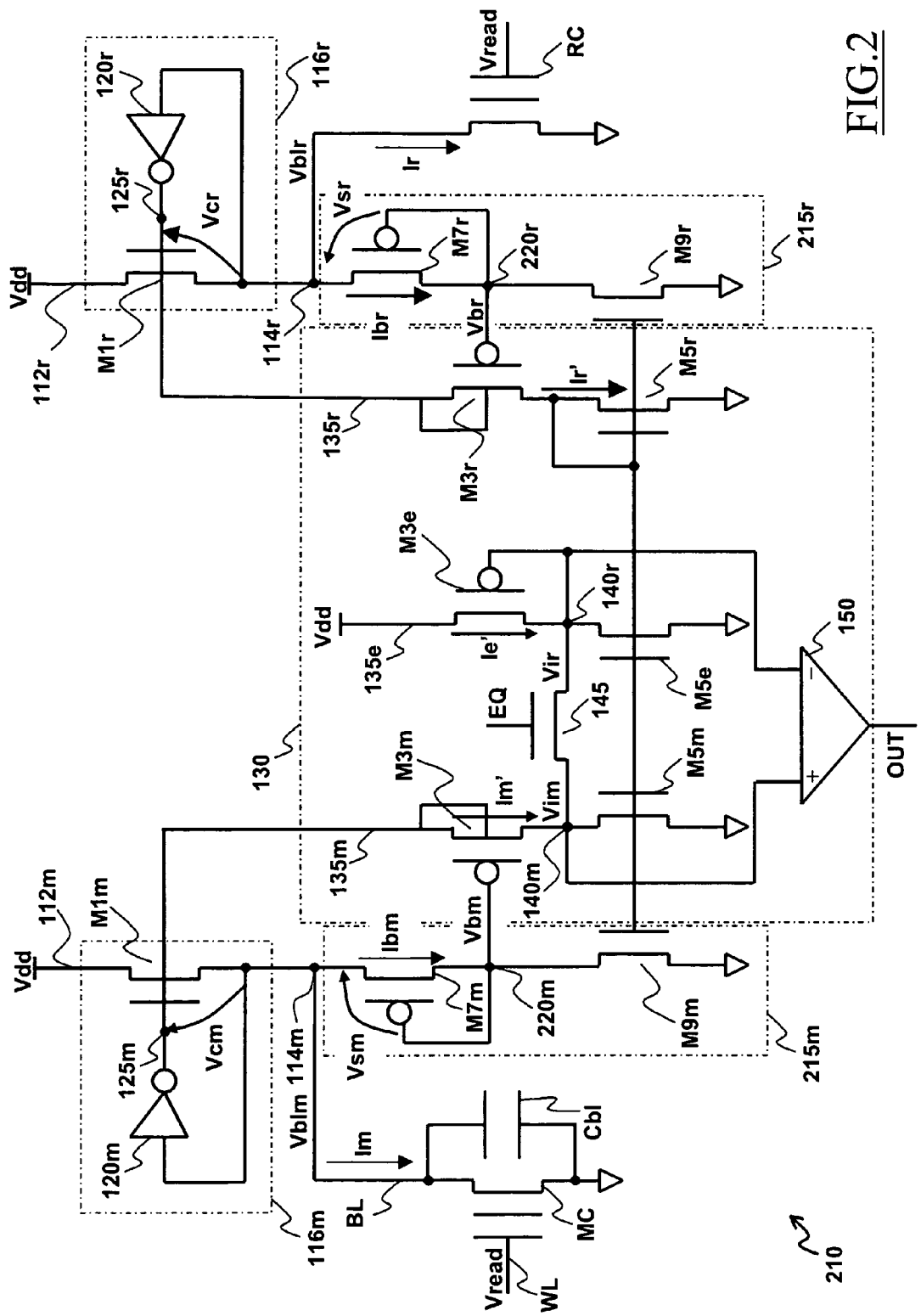
FIG. 2 is a schematic diagram of an implementation of the sense amplifier according to an embodiment of the invention.

In order to overcome the above-mentioned drawback, as shown in FIG. 2, a sense amplifier 210 according to an embodiment of the present invention is further provided with voltage shifting circuits 215*m* and 215*r* (in the following description, the elements corresponding to those of the FIG. 1B are denoted with the same references and their description is omitted for the sake of simplicity).

The voltage shifting circuits 215*m* and 215*r* are included in the branch 112*m* and in the circuit 112*r*, respectively. Each voltage shifting circuit 215*m*,215*r* includes a shifting p-MOS transistor M7*m*,M7*r* and a limiting n-MOS transistor M9*m*, M9*r*. The shifting transistor M7*m*,M7*r* and the limiting transistor M9*m*,M9*r* have the drain terminals connected together at a biasing node 220*m*,220*r*; moreover, the shifting transistor M7*m*,M7*r* is diode-connected (with the drain terminal connected to the gate terminal). The limiting transistor M9*m*,M9*r* has the source terminal that is connected to the ground terminal, and the gate terminal that is connected to the gate terminals of the transistors M5*m*, M5*e* and M5*r* (in current mirror configuration). The source terminal of the shifting transistor M7*m*,M7*r* is connected to the input node 114*m*,114*r*. A biasing current Ibm,Ibr flows through the voltage shifting circuit 215*m*,215*r* (with the corresponding biasing voltage reached at the biasing node 220*m*,220*r* that is denoted with Vbm,Vbr).

The gate terminal of the conversion transistor M3*m*,M3*r* is connected to the biasing node 220*m*,220*r* (so as to be connected to the input node 114*m*,114*r* through the shifting transistor M7*m*,M7*r*). Then, the converted (cell and reference) current Im',Ir' now depends on the control voltage Vcm,Vcr plus a shifting voltage Vsm,Vsr (between the gate and source terminals of the shifting transistor M7*m*,M7*r*).

The limiting transistor M9*m*,M9*r* is smaller than the transistor M5*r* so that the corresponding mirroring ratio is lower than 1. Therefore, the biasing current Ibm,Ibr that is mirrored onto the voltage shifting circuit 215*m*,215*r* will be a fraction of the converted reference current Ir' (for example, a tenth). As a result, by keeping the biasing current Ibm,Ibr relatively small (e.g., a few microamperes), the shifting voltage Vsm, Vsr between the input node 114*m*,114*r* and the biasing node 220*m*,220*r* is roughly equal to the threshold voltage of the shifting transistor M7*m*,M7*r* (since the shifting transistor M7*m*,M7*r* is at its conduction limit). Accordingly, the biasing voltage Vbm,Vbr takes a value substantially equal to the bitline voltage Vblm,Vblr minus the threshold voltage of the shifting transistor M7*m*,M7*r*.

In this structure, it not necessary to exploit the body effect on the cascode transistor M1*m*,M1*r* any longer (with its body terminal that is connected to the source terminal as usual), since the conduction of the auxiliary transistor M3*m*,M3*r* is now ensured by the voltage provided by the shifting transistor M7*m*,M7*r*. Moreover, the cascode transistor M1*m*,M1*r* can also be a low-threshold transistor (for example, a natural transistor or a depletion MOS transistor with a negative threshold voltage), with the simple addition of a further mask in the manufacturing process of the memory device.

Therefore, the sense amplifier 210 raises the maximum value that can be reached by the bitline voltage Vblm,Vblr (equal to the supply voltage Vdd minus the threshold voltage of the cascode transistor M1*m*,M1*r*) to a value close to the supply voltage Vdd. Accordingly, it is possible to exploit the sense amplifier 210 in very low power supply applications (with the supply voltage Vdd having a value down to 1.0-1.2 V), without adversely affecting the access time of the memory device.

Figure 3:
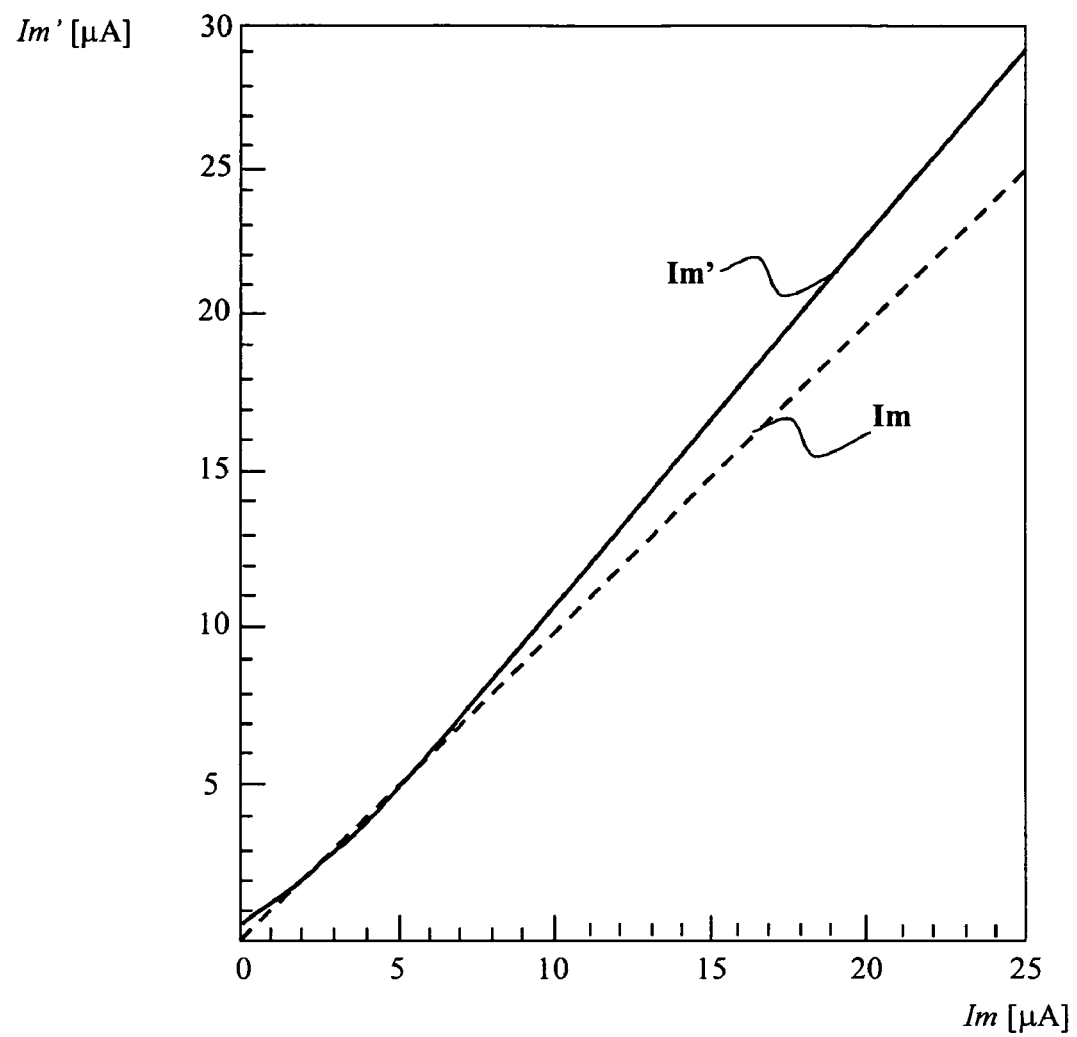
FIG. 3 is an exemplary diagram showing the relation between an operative current of the sense amplifier and a current sunk by a memory cell to be read according to an embodiment of the invention.

Referring to FIG. 3, the converted cell current Im' vs. the cell current Im is shown in a simulation of the sense amplifier according to an embodiment of the present invention. Steady-state values of the converted cell current Im' are provided on the axis of ordinates, whereas steady-state values of the cell current Im are provided on the axis of the abscissas. The converted cell current Im' is represented in continuous line; the cell current Im, represented in dashed line, is only shown for clarity of illustration (obviously corresponding to a line with slope 1).

As described above, the converted cell current Im' is proportional to the cell current Im and, particularly, greater than the cell current Im. Furthermore, the corresponding relation between the converted cell current Im' and the cell current Im is increasing monotonic.

Figure 4A:
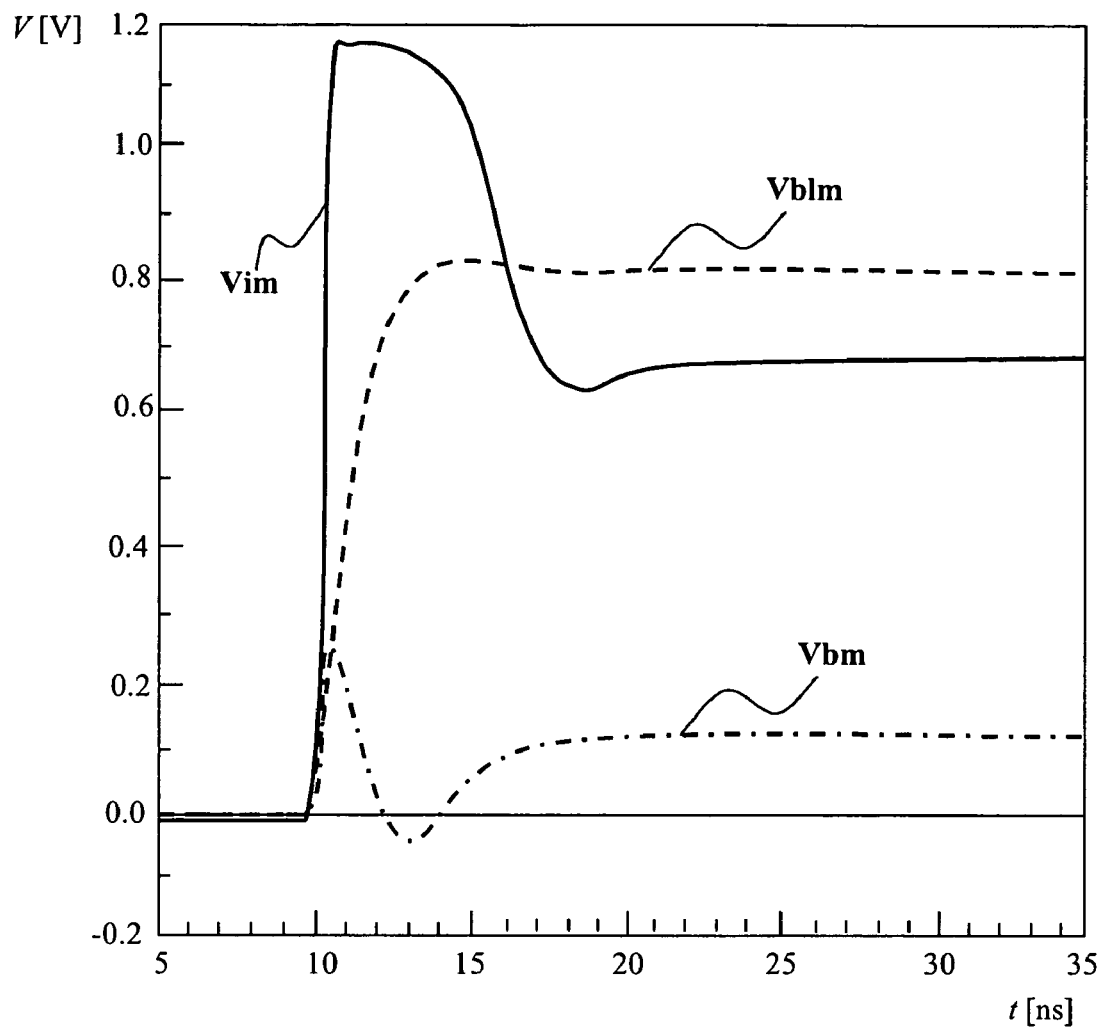
FIGS. 4A-4B show exemplary voltages at nodes of the sense amplifier versus time for different conditions of the memory cell to be read according to an embodiment of the invention.
Figure 4B:
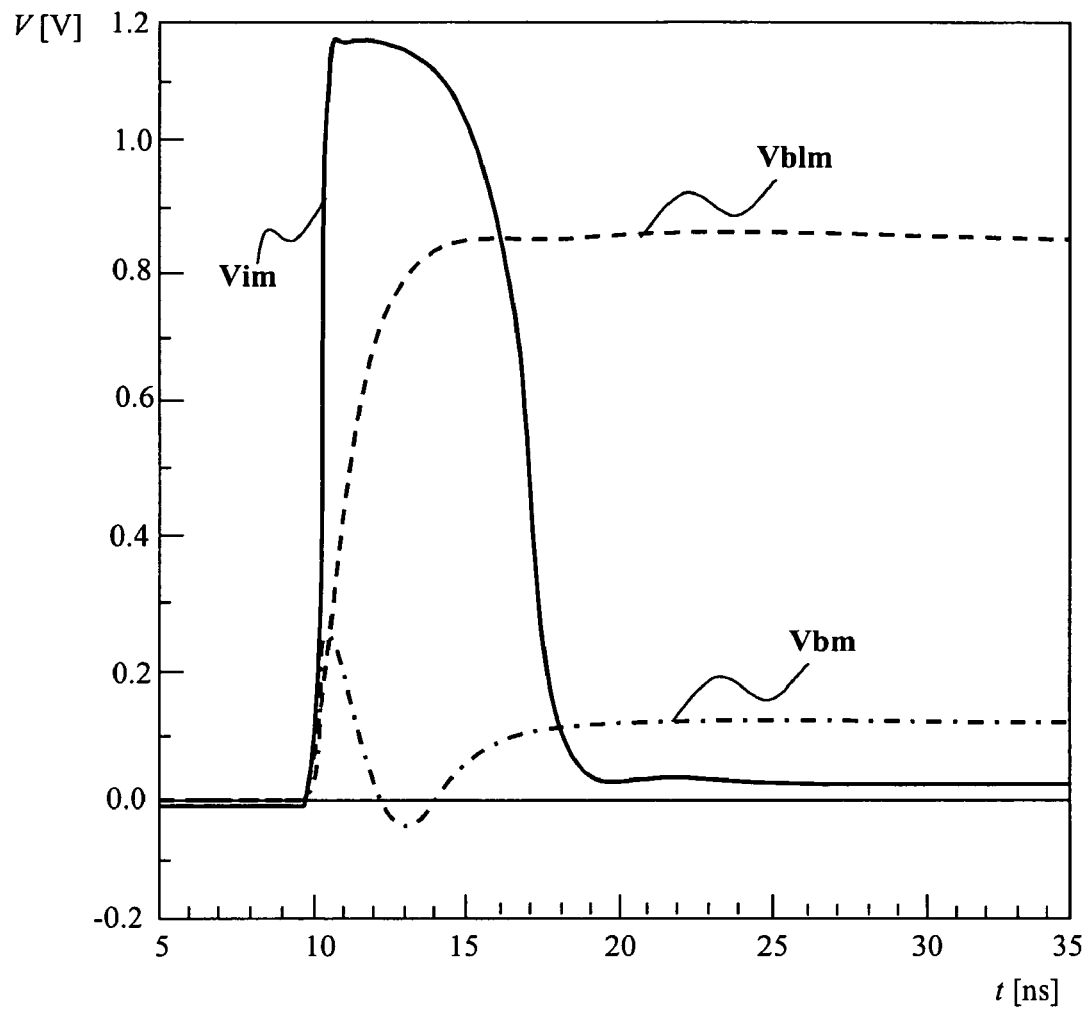

FIG. 4A and FIG. 4B show the input voltage Vim (continuous line), the bitline voltage Vblm (dashed line) and the biasing voltage Vbm (dotted dashed line) vs. time when the memory cell to be read stores the logic value '1' and the logic value '0', respectively. These graphs are obtained by simulation of a memory device according to an embodiment of the present invention with a supply voltage Vdd equal to 1.2 V (with no equalization).

During an initial transient phase of about 20 ns due to the bitline precharge, first the input voltage Vim raises towards the supply voltage Vdd and then it moves down towards its target value. After the transient phase the input voltage Vim, the bitline voltage Vblm and the biasing voltage Vbm reach their steady-state values.

When the memory cell stores the high logic value '1', the bitline voltage Vblm reaches a steady-state value of about 0.8 V, the biasing voltage Vbm a steady-state value of about 0.1 V, and the input voltage Vim a steady-state value of about 0.7 V (FIG. 4A).

On the other hand, when the memory cell stores the low logic value '0', the bitline voltage Vblm reaches a steady-state value of about 0.85 V, the biasing voltage Vbm a steady-state value of about 0.15V, and the input voltage Vim a steady-state value of about 0 V (FIG. 4B).

Thus, it is observed that the sense amplifier can work with low supply voltages and, at the same time, it can ensure a good accuracy; indeed, the input voltage Vim has a relatively large swing (between 0 V and 0.7 V in the example at issue). Furthermore, the bitline voltage Vblm reaches its steady-state value relatively quickly, so that the access time of the memory device is not adversely affected (for example, it is maintained at a few tens of nanoseconds).

Naturally, in order to satisfy local and specific requirements, a person skilled in the art may apply to the solution described above many modifications and alterations. Particularly, although an embodiment of the present invention has been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components. Particularly, the memory cells may be of the multi-level type (such as at four-levels for storing 2 bits of data); in this case, the architecture of the sense amplifier changes accordingly (with more than one reference cell being necessary for a reading operation on a selected memory cell and, possibly, more than one voltage comparator). Alternatively, the reference current may be substantially equal, for example, to the conduction current Im'1', and the current mirror in the differential stage is correspondingly unbalanced, that is, the mirrored current is not equal but proportional (according to a prescribed proportionality factor) to the reference current.

In a different implementation, the reference cell can be included in the matrix of the memory device (for example, with one or more reference cells that are included in each row); moreover, it is possible to have a common reference branch that is shared by a bank of sense amplifiers. In any case, the comparison of the current sunk by the selected memory cell with any other reference value (even provided by a dedicated circuit) is contemplated.

Alternatively, the inverter connected to the cascode transistor may be replaced with a one- or two-stage differential amplifier.

Without departing from the principles disclosed herein, other circuital solutions may be exploited for implementing the different components of the proposed sense amplifier (for example, with any number and/or type of transistors).

In any case, the use of a cascode transistor with a standard threshold voltage falls within the scope of the invention.

It should be apparent that the current flowing through the shifting transistor might be limited to another fraction of the converted reference current; alternatively, the same result may be achieved with a dedicated circuit (even not based on the reference current). However, a simplified implementation without this feature is not excluded.

Moreover, the equalization of the output nodes may be omitted (with the service branch of the differential stage that is not provided); in this embodiment, the reference output node is directly arranged along the reference branch or a voltage generator provides the reference input voltage (to be compared with the measure input voltage) to the comparator.

Similar considerations apply if the sense amplifier of the invention is used in any other memory device (for example, an EPROM, an $E^2$PROM, and the like).

Moreover, the memory device 100 of FIG. 1 including one or more sense amplifiers 210 of FIG. 2 may be incorporated in an integrated circuit, which may be included in a system such as a computer system or a system on a chip.

From the foregoing it will be appreciated that, although specific embodiments of the invention have been described herein for purposes of illustration, various modifications may be made without deviating from the spirit and scope of the invention.

What is claimed is:

1. A sense amplifier for reading a memory cell storing a data value, the sense amplifier comprising:
   a first circuit operable to be coupled to the memory cell and to generate a raw read signal during a read of the memory cell;
   a second circuit coupled to the first circuit and operable to generate an intermediate read signal from the raw read signal;
   a third circuit coupled to the second circuit and operable to generate a comparison read signal in response to the intermediate read signal;
   a fourth circuit operable to generate a raw reference signal during the read of the memory cell; and
   a fifth circuit coupled to the fourth circuit and operable to generate an intermediate reference signal from the raw reference signal,
   wherein the third circuit is coupled to the fifth circuit and is operable to generate a comparison reference signal in response to the intermediate reference signal.

2. The sense amplifier of claim 1, further comprising a comparator coupled to the third circuit and operable to:
   determine a difference between the comparison read signal and the comparison reference signal; and
   indicate the data value stored in the memory cell in response to the difference.

3. The sense amplifier of claim 1 wherein the first circuit comprises:
   a supply node;
   a transistor having a first drive node coupled to the supply node, a second drive node coupled to the memory cell, and a control node; and
   an inverting amplifier having an input node coupled to the second drive node of the transistor and having an output node coupled to the control node of the transistor.

4. The sense amplifier of claim 1 wherein the first circuit comprises:

a supply node;

a depletion-mode transistor having a first drive node coupled to the supply node, a second drive node coupled to the memory cell, and a control node; and an inverting amplifier having an input node coupled to the second drive node of the transistor and having an output node coupled to the control node of the transistor.

5. The sense amplifier of claim 1 wherein the first circuit comprises:

a supply node;

a natural transistor having a first drive node coupled to the supply node, a second drive node coupled to the memory cell, and a control node; and an inverting amplifier having an input node coupled to the second drive node of the transistor and having an output node coupled to the control node of the transistor.

6. The sense amplifier of claim 3 wherein the second circuit comprises:

a supply node;

a first transistor having a first drive node operable to receive the raw read signal from the first circuit, a second drive node operable to provide the intermediate read signal, and a control node coupled to the second drive node; and a second transistor having a first drive node coupled to the second drive node of the first transistor, a second drive coupled to the supply node, and a control node operable to receive a reference signal.

7. The sense amplifier of claim 1 wherein the raw, intermediate, and comparison read signals respectively comprise raw, intermediate, and comparison read voltages.

8. The sense amplifier of claim 1, wherein the raw, intermediate, and comparison read signals respectively comprise raw, intermediate, and comparison read currents.

9. A memory, comprising:

a bit line;

a memory cell coupled to the bit line and operable to store a data value;

a sense amplifier coupled to the bit line and comprising, a first circuit operable to generate a raw read signal on the bit line during a read of the memory cell, a second circuit coupled to the bit line and operable to generate an intermediate read signal from the raw read signal, a third circuit coupled to the second circuit and operable to generate a comparison read signal in response to the intermediate read signal, a fourth circuit operable to generate a raw reference signal during the read of the memory cell, a fifth circuit coupled to the fourth circuit and operable to generate an intermediate reference signal from the raw reference signal, and wherein the third circuit is coupled to the fifth circuit and is operable to generate a comparison reference signal in response to the intermediate reference signal; and a comparator coupled to the third circuit and operable indicate the data value by comparing the comparison read signal to the comparison reference signal.

10. An electronic system, comprising:

a memory, including, a bit line, a memory cell coupled to the bit line and operable to store a data value, a sense amplifier coupled to the bit line and comprising, a first circuit operable to generate a raw read signal on the bit line during a read of the memory cell, a second circuit coupled to the bit line and operable to generate an intermediate read signal from the raw read signal, a third circuit coupled to the second circuit and operable to generate a comparison read signal in response to the intermediate read signal, a fourth circuit operable to generate a raw reference signal during the read of the memory cell, a fifth circuit coupled to the fourth circuit and operable to generate an intermediate reference signal from the raw reference signal, and wherein the third circuit is coupled to the fifth circuit and is operable to generate a comparison reference signal in response to the intermediate reference signal, and a comparator coupled to the third circuit and operable indicate the data value by comparing the comparison read signal to the comparison reference signal.

* * * * *